United States Patent
Braumann et al.

[11] Patent Number: 5,745,339
[45] Date of Patent: Apr. 28, 1998

[54] PACKING ELEMENT INCLUDING A FOAM PLASTIC BODY AND A DEVICE RELATING TO THIS PACKING ELEMENT

[76] Inventors: Gundokar Braumann, Galileistrasse 10, 82152, Planegg/Martinsried; Ralf H. F. Seitz, Kederbacherstr. 18, 81377, München, both of Germany

[21] Appl. No.: 833,460

[22] Filed: Apr. 7, 1997

Related U.S. Application Data

[63] Continuation of Ser. No. 430,674, Apr. 28, 1995, abandoned.

[30] Foreign Application Priority Data

Apr. 30, 1994 [DE] Germany ................... 44 15 200.0

[51] Int. Cl.⁶ .................... H05K 5/02; H05K 7/02
[52] U.S. Cl. .............. 361/679; 174/50; 174/52.1; 361/728; 361/746; 361/820; 361/730
[58] Field of Search ................... 174/52.1, 52.4, 174/50, 52.6, 35 R, 35 GC, 35 MS; 206/701, 706, 707; 220/4.02, 4.05, 4.06, 4.07; 361/600, 609, 916, 679, 728, 746, 747, 753, 757, 759, 820, 821, 822, 823, 824, 744, 735, 790; 439/68, 485; 257/531

[56] References Cited

U.S. PATENT DOCUMENTS

| | | | |
|---|---|---|---|
| 3,349,481 | 10/1967 | Karp | 257/531 |
| 4,296,454 | 10/1981 | Wong | 361/679 |
| 4,602,310 | 7/1986 | Fenster | 361/212 |
| 4,732,446 | 3/1988 | Gipson et al. | 361/764 |
| 4,950,181 | 8/1990 | Porter | 361/704 |
| 4,969,827 | 11/1990 | Hahs, Jr. | 439/68 |
| 5,099,392 | 3/1992 | Miller et al. | 361/760 |
| 5,473,507 | 12/1995 | Schwegler et al. | 361/679 |
| 5,541,366 | 7/1996 | Maoz et al. | 174/254 |

FOREIGN PATENT DOCUMENTS

| | | |
|---|---|---|
| 41 15 703 C1 | 5/1991 | Germany. |
| 41 38 818 A1 | 11/1991 | Germany. |
| G 91 16 755.8 | 11/1991 | Germany. |
| 2 191 896 | 3/1987 | United Kingdom. |
| 2 256 540 | 6/1991 | United Kingdom. |
| WO92/17045 | 10/1992 | WIPO ................... 361/744 |

*Primary Examiner*—Donald Sparks
*Attorney, Agent, or Firm*—Lowe, Price, LeBlanc & Becker

[57] ABSTRACT

The invention relates to a packing element, which can be used for packing and arranging one or more electric components of an appliance, depending on the case together with the same or similar packing elements; the packing element (1,3,4) has at least one current-conducting or light-conducting conducting track (10,11,12,17,18,43,44). Moreover, the invention relates to a device such as a Personal Computer in which this packing element is used.

18 Claims, 2 Drawing Sheets

PACKING ELEMENT INCLUDING A FOAM PLASTIC BODY AND A DEVICE RELATING TO THIS PACKING ELEMENT

This application is a continuation of application Ser. No. 08/430,674 filed Apr. 28, 1995 now abandoned.

FIELD OF THE INVENTION

The present invention relates to a packing element which can be used for packing and arranging components of an appliance or device, depending on the case together with the same or similar packing elements, and to a device in which at least one packing element mentioned is used.

BACKGROUND OF THE INVENTION

In order to make the assembly of electric appliances such as Personal Computers easier and less expensive, elements or support units, which are designated as packing elements in this case, have been developed; these have the function of arranging and holding between them electric components such as drives, printed wiring boards etc. of the electric appliance or of the device, i.e. of packing, supporting or accommodating them into a casing or holder without the conventional mechanic bolted connections and mounts for attaching the electric components within and to the casing being necessary. The packing elements are usually bodies made of plastic that can be foamed.

These packing elements are, for example, described in utility model DE- G 91 16 755.8 U1, in which the chassis of an appliance such as a computer or electronic measuring equipment embraces two support units of plastic which have recesses and which are arranged one upon the other; these support units are, at least partially, adjusted or adapted to the exterior shapes of the components of the appliance in order to hold or fix the components in or in-between the support units or packing elements in a basically form-locking way without conventional fasteners being used. By using such packing elements the disassembling of an appliance can easily be carried out, which is required for repairing the appliance. During disassembling the appliance the packing elements are removed for releasing the components of the appliance without the use of any tools. This is effected since the components of the appliance are arranged and held between the packing elements without using any mounting means, e.g., soldering or fasteners. It is hereby explicitly pointed out that the complete content of DE G 91 16 755.8 U1 is incorporated by reference herein.

For connecting the electric components of the appliance with each other and to the exterior, for example for connecting a component of an appliance to a switch on the casing of the appliance, the assembly of corresponding wires with plug-contacts or similar fasteners is still required, however.

SUMMARY OF THE INVENTION

The object of the present invention is to provide packing elements which allow considerable simplification and time-saving in the assembly of the entire appliance or device in which they are used.

This object is solved by the packing element of the present invention.

Accordingly, the packing element of the present invention generally has one or more conducting tracks or conductors, e.g. printed conductors, lines, strips or fibers, which can conduct electricity or light. These conducting tracks can be found in different sizes on the surface or in one surface area of the packing element depending on the functions of the individual conducting track.

The conducting tracks or conductors can also occur in the form of a through-connection in the packing element.

There can be several conducting tracks next to each other extending parallelly. The conducting tracks can, for example, have the function of transmitting 16 or 32 bit data (data bus), of transmitting control signals (control bus), of transmitting address signals (address bus), but they can also serve as mass lines or mains current lines.

The conducting tracks can extend on or in the surface area of several sides of the surface of the packing element.

The conducting track is preferably made of electrolyte copper or any other material that is suitable for electrical conducting tracks such as silver, gold, aluminium etc.

The edges of the packing element over which the conducting tracks run are preferably rounded off—at least in the areas around the conducting tracks—in order to prevent too much bending stress of the conducting track running over the edge and thus to prevent the formation of cracks or damage of the conducting track in the area where it is bent.

The conducting tracks can have one or more segments, which serve for contacting, i.e. as contact segments or portions. These segments can be broadened compared to the usually relatively thin and long conducting tracks in order to form a sort of contact spot or electrical contacting pad. For the packing or arrangement of a component of an appliance usually several packing elements are used one upon or next to each other to arrange the component of the appliance. It is thus an advantage to arrange the conducting tracks on the surfaces of bordering packing elements in such way that their contact segments lie on each other or touch for contacting. The contact between the packing elements makes it possible for a conducting track to extend over several packing elements without complex wiring with plug-contacts and cable forms being necessary.

The given contact segments of the conducting tracks of a packing element can also have the function, however, of effecting a contact to contact elements such as contact surfaces, contact springs etc. of the electric component fixed by the packing element.

The contact segments of the conducting track can also have the function of contacting with an external contact device such as a spring contact etc. which is, for example, mounted on the casing of the appliance. In this way the contact between the packing element and the casing of the appliance can be effected.

A preferable packing element (also without conducting track) in its first shape (first type) has one or more projections, which stick out or project from the packing element. A preferable packing element in its second shape (second type) in contrast has one or more recesses. If the packing element of the first type is put onto the packing element of the second type, for example to arrange an electric component of a device between these two packing elements, the projections of the packing element of the first type fit into the recesses of the packing element of the second type. Thus an exact adjustment or positioning to or orientation of the packing elements towards each other of the connector type or plug-socket (or jack) type becomes possible.

On the projections and in the recesses preferably corresponding conducting tracks extend, which run along or on the projections or recesses in such way that, when arranging the projections into the recesses, i.e. when the packing element of the first type is arranged onto the packing element of the second type, a contact between the conducting tracks of the packing elements which are arranged facing each other, is effected.

The projections of the packing element of the first type taper preferably conically, namely in the direction leading away from the packing element. Correspondingly the recesses can taper conically. When inserting the projections into the recesses, an even more exact adjustment and direction of the packing elements towards each other is achieved. Furthermore, due to the conical shape of the touching surfaces of the recesses and the corresponding projections, a certain contact pressure can be obtained between the contacts in the recess area and the area of the projections; this contact pressure enables secure electric contacting between the two packing elements.

The conducting tracks can be sunk or accommodated into corresponding recesses or grooves in the surface area of the packing element or they can lie open on the surface of the respective packing element.

The conducting tracks which are sunk into grooves are used, for example, if there are bordering packing elements which respectively have conducting tracks that lie one upon another or cross, but which shall not contact. On the conducting tracks an insulation layer can be applied. This insulation layer can exclusively be applied in the groove over the conducting track.

The conducting tracks can be coated with a protective layer or passivating layer.

In the device according to the present invention one or more of these packing elements are used, which fix one or more electric components or electromechanical components or simply components of the device in a holder such as a casing.

The holder can, for example, also consist of an installation such as one or more belts or strips which enclose the assembled packing elements with the electric components arranged in-between. The holder or casing can have a locking mechanism that holds the holder together. This locking mechanism can, for example, be in the form of a snap or snap lock or pull buckle and thus makes it possible that a remaining pressure is exerted on the packing elements, which provides for secure contacting between the packing elements and the components of the device as well as between the packing elements or components of the device and the exterior, for example contacts on the casing.

The packing elements according to the present invention are preferably used in a computer unit such as a Personal Computer.

Further advantages and applications of the present invention can be seen from the following description—in combination with the enclosed drawings—of different embodiments of the invention:

DESCRIPTION OF THE PREFERRED EMBODIMENTS

Figure 1:
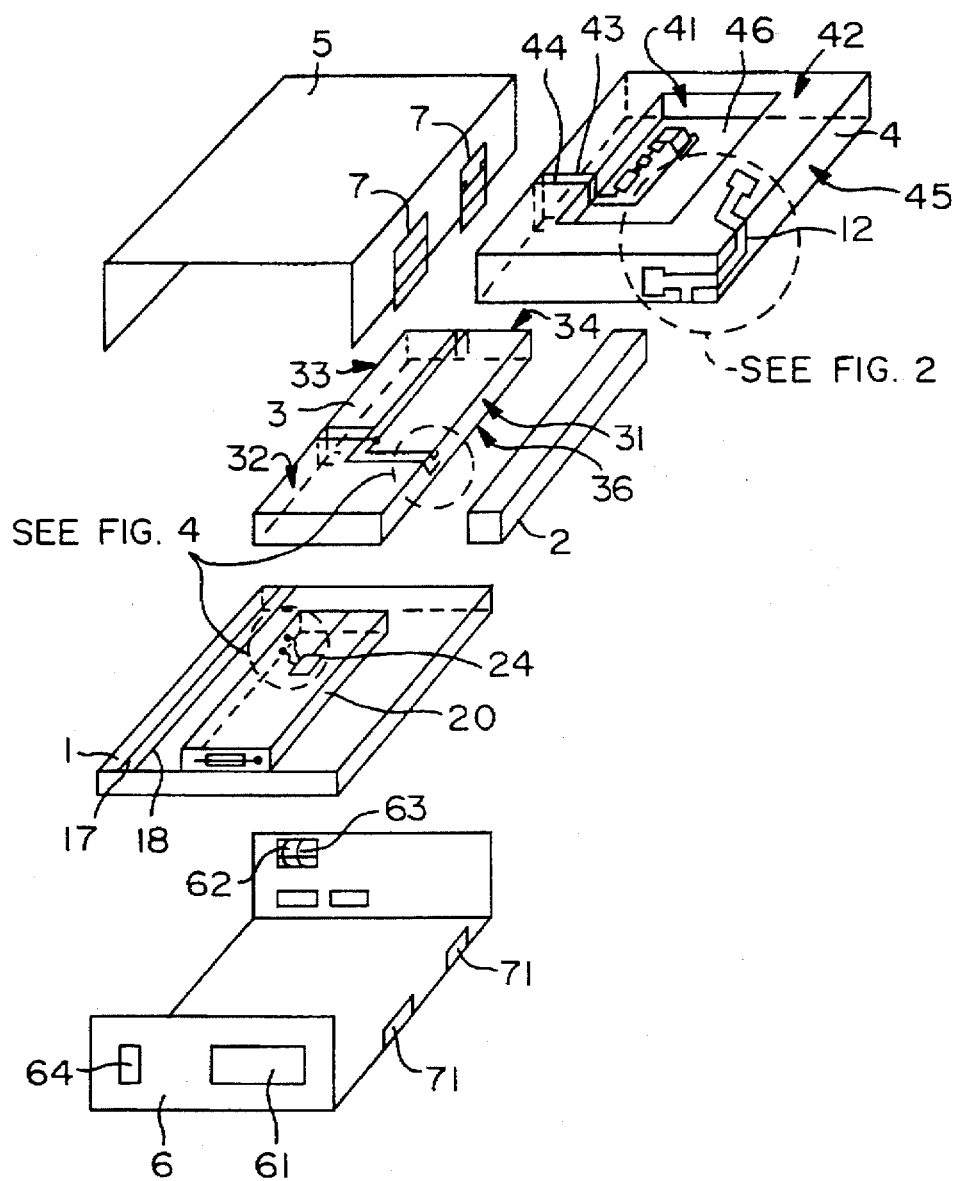
FIG. 1 schematically shows an exploded view of a computer according to an embodiment of the present invention with a casing, several packing elements according to an embodiment of the invention and a drive between the packing elements which is to be considered an exemplary electric component of an appliance.

In FIG. 1 the subject of the present invention is explained schematically on the basis of the example of a Personal Computer. A Personal Computer includes in the main a casing with a casing base 6, a casing top 5, a cuboid-shaped, relatively flat packing element 1 which can be placed onto the bottom of the casing base 6, middle packing elements 3 and 2 which, when the Personal Computer has been assembled, are arranged on the lower packing element 1, and an upper packing element 4 which, when the Personal Computer has been assembled, is arranged on the middle packing elements. With the assembly finished the lower packing element 1, the middle packing elements 3 and 2 and the upper packing element 4 enclose a disk drive 20, which is thus enclosed, at least partially, in a form-locking or a form-fitting or shape-adapting way by the packing elements and is thus held within the casing. With the assembly of the Personal Computer finished according to FIG. 1, the lower packing element 1, the middle packing elements 3 and 2 and the upper packing element 4 are arranged form-locking and conclusively to each other in the casing base one upon the other in the mentioned order. The insertion slot at drive 20 provided for the diskette is in this case on a level with the insertion opening of the casing base 6 so that a diskette can be inserted into the insertion slot of drive 20 through the insertion opening 61 (further components of the Personal Computer have been left out in FIG. 1 for simplification reasons).

After arranging the packing elements and drive 20, which is form-locking enclosed by the packing elements, the casing top 5 is put on so that the parts 7 at the casing top 5 engage with the parts 71 at the casing base 6; thus a snap-type lock or catch-type lock is formed which can easily be opened or released. On the opposite side a hook-and-eye connection can be provided (which is not shown in the figures) to attach the casing top 5 to the casing base 6.

On the surface of the lower packing element 1 two parallel-running conducting tracks 17 and 18 can be seen in FIG. 1 which extend on the surface of the lower packing element 1 up to a switch 64 at the casing base 6 and contact the contacts of the latter.

At drive 20, which, according to the exploded view in FIG. 1, is located on the top side of the lower packing element 1, a printed wiring board 24 can be seen, which is arranged in the interior of drive 20 and from which two schematically indicated conducting tracks or wires extend, namely starting from the printed wiring board 24 outwards to the outside of drive 20 (to the outside of its casing). On the outside of drive 20 these conducting tracks 22 and 23 end in broadened segments, which form contact segments or contact fields or contact areas and lie open on or a exposed to the outside of drive 20 to counter-contact with other contact areas.

The middle packing element 3 has a surface with a relatively narrow lateral face 31 and an opposing lateral face 33 of the same size, whereby the lateral face 31 passes into the lateral face 33 of the surface of the middle packing element 3 via a top side 32. The lateral face 31 as well as the lateral face 33 approximately have the same level or niveau as drive 20 in order to lie flush with the latter when the packing element 3 is put onto the lower packing element 1 next to drive 20. On the surface of packing element 3 two substantially parallel-running conducting tracks 10 and 11 extend.

Figure 4:
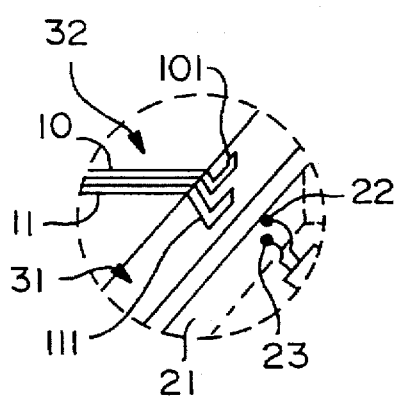
FIG. 4 shows a detailed view of contacting means of a packing element shown in FIG. 1 and of corresponding contacting means of a component (Drive) of the appliance according to FIG. 1.

These conducting tracks 10 and 11 extend starting from the top side 32 of the middle packing element to the lateral face 31 and thereby run over the edge which represents the transition between the top side 32 of packing element 3 and the lateral face 31 of packing element 3. This edge is rounded off in order to prevent too much bending and, therefore, possible damage of the conducting tracks 10 and 11 in the area of the edge (FIG. 4).

The conducting tracks 10 and 11 end on the lateral face 31 of packing element 3 with broadened contact segments 101 and 111 respectively. The contact segments 101 and 111 serve for contacting with the contact segments of the conducting tracks 22 and 23 on the casing outside 21 of drive 20 when the packing elements are arranged with the assembly finished.

The conducting tracks 10 and 11 extend on the top side 32 of the middle packing element 3 to the back side 34 of the middle packing element 3; hereby they run over the edge between top side 32 and back side 34 of packing element 3, which is rounded off—at least in the conducting track area—as well.

The conducting tracks 10 and 11 extend on a kind of branch starting from the top side 32 of packing element 3 over a correspondingly rounded-off edge to the lateral face 33 of the middle packing element 3, where they extend further (only schematically indicated in FIG. 1) over a corresponding edge to the bottom side 36 of packing element 3, which is located facing the top side of the lower packing element 1.

The segments of the conducting tracks 10 and 11 in the bottom side 36 area of packing element 3 serve for contacting with the conducting tracks 17 and 18 on the top side of the lower packing element 1.

The conducting tracks 10 and 11 extending on the back side 34 of packing element 3 also end in broadened contact segments, which can in general be of any shape, especially circular, rectangular or oval-shaped. These contact segments serve for contacting with the spring contacts 62 and 63 at the casing base 6, which in turn are connected by plug pins. In this way a contact is effected between the conducting tracks 10 and 11, which are formed and extend along the surface of packing element 3, to the exterior, namely to the spring contacts 62 and 63 of a plug unit at the casing base.

Figure 2:
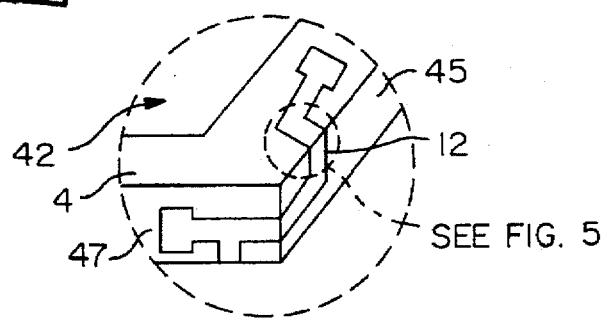
FIG. 2 shows a detailed view along line II of a packing element of FIG. 1.

The upper packing element 4 has a top side 42, in which a sunken recess 41 with a bottom 46 is provided. The top side 42 of the upper packing element 4 passes into a lateral face 45 of packing element 4 via an edge 50 (compare FIG. 2), whereby the lateral face 45 and the top side 42 of packing element 4 pass into a front side 46 at a corner edge of the packing element.

On the top side 42 of the upper packing element 4 two parallel conducting tracks 43 and 44 extend as well, which extend into the recess 41 and continue on the bottom 46 of recess 41. On the bottom 46 of recess 41 also electronic parts or components such as resistors, capacitors, coils, integrated circuits, lines, hybrid circuits, electromechanical components, electro-optic components etc. can be arranged; these parts are provided, for example, in the form of SMD (Surface Mounted Devices)-units and are connected to the conducting tracks and connecting parts on bottom 46 by means of corresponding bonding methods (such as ultrasonic bonding, soldering, pressure bonding or others).

The parts can, depending on the case, also be attached to the surface of a packing element in another way without the use of a recess.

The conducting tracks 43 and 44 of the upper packing element also extend to a lateral face 47, which lies opposing to the lateral face 45 (indicated schematically); from this lateral face 47 they extend to the bottom side of packing element 4, where the corresponding segments of the conducting tracks 43 and 44 serve as contact areas for contacting the conducting tracks 10 and 11, which extend from the top side 32 of the middle packing element 3 to the back side 34 of packing element 3. Crossing conducting tracks are separated from each other by a correspondingly applied insulation layer in order to prevent short circuits.

Figure 5:
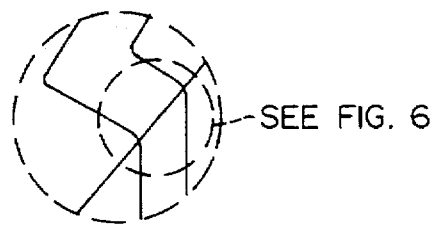
FIG. 5 shows a detailed view taken from FIG. 2.
Figure 6:
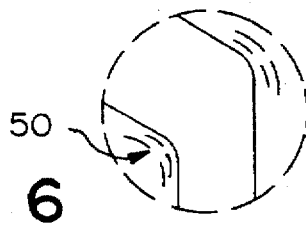
FIG. 6 shows a detailed view of FIG. 5.

On the surface of packing element 4 a relatively broad conducting track 12 is attached which is shown schematically for clarity reasons. This conducting track is connected to ground, for example, in order to prevent static charging of packing element 4. This broad conducting track 12 extends from the top side 42 of packing element 4 over edge 50 to the lateral face 45 of packing element 4 and then along the lateral face 45 over a corner edge to the neighbouring front side 47. Edge 50 is rounded off—at least in the conducting track 12 area—as can be clearly seen from FIGS. 2, 5 and 6.

The arrangement of conducting tracks and corresponding contacts on packing elements advantageously makes it possible to do without a number of cables and plugs that would otherwise be necessary for the various components to contact among each other and with the exterior. In the final assembly, for example of a Personal Computer, a considerable amount of assembly time is thus saved. Furthermore it is thus possible to do without the cable channels required in conventional packing elements, which altogether leads to a more compact and space-saving construction of the packing elements and consequently of the entire electric appliance such as the Personal Computer. Moreover, the direct arrangement of conducting tracks on the packing elements makes it possible to do away with malfunctioning, which occurs in conventional cable arrangements due to loose contacts in the wiring and in the soldered areas or due to bends in the wiring.

Figure 3:
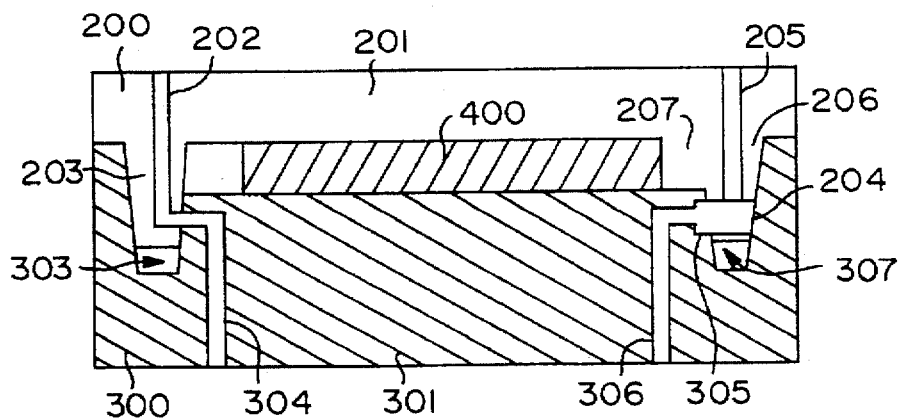
FIG. 3 shows a schematic side-view of two packing elements according to the present invention which, when fitted together, hold a component of an appliance (indicated schematically) between them.

In FIG. 3 a preferred embodiment of the invention for contacting between conducting tracks on different packing elements is schematically shown, namely in form of a side-view of two packing elements 201 and 301 arranged one upon the other between which an electric component such as a drive or a printed wiring board 400 is arranged.

The upper packing element 201 has a basically cuboid-shaped main body 200, from which basically the projections 203 and 206 stick out or project in a rotationally symmetrical and—with increasing distance from the main body 200—conically tapering way. In the surface area of packing element 201 a visible conducting track 202 extends into the area of the conical projection 203. In the same manner a conducting track 205 in the surface area of packing element 201 extends into the area of the conical projection 206. The conducting track 205 ends in a considerably broadened contact segment 204 in the area of the conical projection 206; this contact segment extends annularly around the rotationally symmetrical projection 206.

The lower packing element 301 has recesses 303 and 307 at some distance from each other which are both rotationally symmetrical and taper conically towards their bottoms. The packing element 301 has a bent conducting track 304 which extends into the surface area of the conical recess 303.

Furthermore the packing element 301 has a conducting track 306 which—with a bend—passes into a broadened contact segment 305, which extends into the surface area of recess 307.

When the upper packing element 201 is put onto the lower packing element 301 in the assembly in order to arrange the electric component 400 in-between, the projections 203 and 206 of the upper packing element 201 engage with the conical recesses 303 and 307 of the lower packing element 301. Due to the conical shape of the projections and the corresponding recesses a pressure is exerted between the corresponding conical surfaces in the projection area and in the recess area when packing element 201 is put onto packing element 301; this causes the conducting tracks 202 and 304 in the projection 203 area or recess 303 area and the contact segments 204 and 305 of the conducting tracks 205 and 306 being pressed together firmly in the surface area of the conical projection 206 or conical recess 307, thus enabling secure contacting of the conducting tracks with each other.

In FIG. 3 a stop 207 at the packing element 201 can be seen which serves as a spacing piece between the packing elements 201 and 301.

In the manufacture of the packing element according to the present invention, expanding polypropylene, for example, is used as plastic. The polypropylene is in the form of polypropylene pellets, which are foamed in a known process in order to form polypropylene globules. The droplets are injected into the mold provided for the packing element to be manufactured with a pressure of 4 bar; the mold hereby corresponds to the structures and shapes desired for the respective packing element. This step leads to a decrease in volume. In the following step a suction or a pressure below atmospheric pressure is built up so that the volume increases again, and the shape of the mold is imparted on the polypropylene droplets. Then hot steam of about 180° Celsius (356° Fahrenheit) is blown in so that the droplets grow together at their surfaces (cross-linking). Then the mold is opened and the foamed part is taken out. Finally the foamed part is annealed or tempered in order to obtain the finished packing element.

Expanding polypropylene has several advantageous properties. It has, for example, a very high stability of shape but is still elastic and energy-absorbing. This ensures a shock-protected assembly of the components in the casing of the appliance. The deformability or elasticity of polypropylene can be influenced by the density of the material. The density of polypropylene can, for example, be in the range of about 60 to 80 g/l, which results in high stability of shape. By altering the density, the hardness (i.e. stability of shape) and the shock-absorbing properties can be adjusted: the lower the density, the softer the material, which results in better shock-absorbing properties. The higher the density, however, the harder the material, which results in better stability of shape and makes the manufactured packing element more suitable as support or carrier of conducting tracks.

Another advantage of polypropylene is its relatively high thermal stability. Moreover, polypropylene can be completely recycled. Polypropylene is also a relatively light material and has chemically resistant properties.

A further advantage of polypropylene is the fact that it is chemically inert towards all possible solvents and is thus suitable as material for packing elements for the processing in connection with the arrangement of conducting tracks on packing elements.

As an alternative to polypropylene, other plastic materials with high stability of shape such as polyurethane or polyethylene can be used.

The conducting tracks can be manufactured in a conventional negative or positive process by means of photo printing or silk-screen printing on the surface of the respective packing element or in the recesses on the surface of the packing element, in which the conducting tracks will run. In the following, the arrangement of conducting tracks on the surface of a packing element by means of the photo process using photo printing will be described.

Copper is galvanized onto the surface of the packing element as a basic material. Depending on the case, grease residues have to be removed from the surface of the packing element with, for example, an alcohol bath beforehand. After the removal of the grease residues, an adhesion effecting layer can be applied before the copper basic material is galvanized onto the surface of the packing element.

After the copper layer has been galvanized onto the surface of the packing element, a photosensitive layer—the photoresist usually used for this purpose—is applied to the copper layer by means of, for example, a spray gun; hereby either the packing element turns and the spray gun is fixed or the spray gun is moved and the packing element is fixed.

After the photosensitive layer of photoresist has been applied it is exposed, namely in those areas where later the actual conducting track will run. For the exposure laser light is used, which is generated by a corresponding laser equipment. The laser is moved over the photosensitive layer of photoresist and emits laser beams onto the layer of photoresist in order to expose it. Alternatively the laser equipment can be fixed and the packing element is moved in order to effect the exposure of the photosensitive layer of photoresist.

After the exposure the packing element with exposed layer of photoresist is put into a developing bath, through which the exposed areas of the layer of photoresist are developed and afterwards hardened. The non-developed areas of photoresist are then removed in a solvent bath, leaving the developed and hardened areas of photoresist on the copper basic material. The developed areas now show the conducting track structure to be produced.

Afterwards the layer areas which are not coated with developed and hardened photoresist are etched away in an etching bath and finally the developed and hardened photo layer is removed. What remains is the conducting track structure to be made on the surface of the respective packing element.

Alternatively to the exposure by means of a laser equipment also a whole body exposure can be carried out, in which case masks are used for structuring the surface of the packing element.

If on a packing element a light-conducting conducting track such as a fiberglass made of plastic is used, the light-conducting fiber can be arranged in a provided recess in the packing element and fixed there by means of gluing, for example.

We claim:

1. A packing element for packing and arranging at least one component within an appliance including an electrical contact, the packing element comprising:

an electrically insulating foamed plastic body shaped to at least partially enclose the at least one component to thereby hold the at least one component in the appliance without additional mounting structure, the foamed plastic body comprising at least one current-conducting track being fixedly and continuously disposed on the foamed plastic body for electrically connecting the at least one component with the electrical contact of the appliance.

2. A packing element according to claim 1, wherein the packing element includes a rounded edge, over which the current-conducting track extends.

3. A packing element according to claim 1, wherein the current-conducting track has at least one broadened end.

4. A packing element according to claim 1, wherein the packing element includes a plurality of current-conducting tracks which extend parallel at a distance to each other.

5. A packing element according to claim 1, wherein the packing element includes a recess with a bottom.

6. A packing element according to claim 5, further comprising electronic elements arranged on the bottom of the recess and connected by current-conducting tracks extending from the bottom of the recess to a top side of a surface of the packing element.

7. A packing element according to claim 5, further comprising electro-optic elements arranged on the bottom of the recess and connected by current-conducting tracks extending from the bottom of the recess to a top side of a surface of the packing element.

8. A packing element according to claim 5, further comprising electromechanical elements arranged on the bottom of the recess and connected by current-conducting tracks extending from the bottom of the recess to a top side of a surface of the packing element.

9. A packing element according to claim 1, wherein the current-conducting track of the packing element comprises a segment adapted to be in contact with the segment of the current-conducting track of another said packing element.

10. A packing element according to claim 1, wherein the current-conducting track of the packing element comprises a segment adapted to be in contact with the electrical contact of another component of the appliance.

11. A packing element according to claim 1, wherein the current-conducting track of the packing element comprises a segment adapted to be in contact with an external contact of the appliance.

12. An appliance comprising:

at least one component;

an electrical contact on the appliance;

at least one packing element for packing and arranging the at least one component in the appliance, the packing element comprising an electrically insulating foamed plastic body shaped to at least partially enclose the at least one component in the appliance without additional mounting structure, the foamed plastic body comprising at least one current-conducting track being fixedly and continuously disposed on the foamed plastic body for electrically connecting the at least one component with the electrical contact of the appliance, and a holder which holds the packing element and the at least one component together.

13. Appliance according to claim 12, wherein the holder forms a casing comprising a casing base, a casing top and a lock holding the two casing parts together, whereby the casing base and the casing top enclose the packing elements with the at least one component held between the packing elements.

14. A packing element for packing and arranging at least one component within an appliance including an optical contact, the packing element comprising:

an electrically insulating foamed plastic body shaped to at least partially enclose the at least one component to thereby hold the at least one component in the appliance without additional mounting structure, the foamed plastic body including at least one light-conducting track being fixedly and continuously disposed on the foamed plastic body for optically connecting the at least one component with the optical contact of the appliance.

15. A packing element according to claim 14, wherein the light-conducting track of the packing element comprises a segment adapted to be in contact with the segment of the light-conducting track of another said packing element.

16. A packing element according to claim 14, wherein the light-conducting track of the packing element comprises a segment adapted to be in contact with the optical contact of another component of the appliance.

17. A packing element according to claim 14, wherein the light-conducting track of the packing element comprises a segment adapted to be in contact with an external contact of the appliance.

18. An appliance comprising:

at least one component;

an optical contact;

at least one packing element for packing and arranging the at least one component within the appliance, the packing element including a foamed plastic body shaped to at least partially enclose the at least one component to thereby hold the at least one component in the appliance without additional mounting structure, the foamed plastic body including at least one light-conducting track being fixedly and continuously disposed on the foamed plastic body for optically connecting the at least one component with the optical contact of the appliance; and a holder which holds the at least one packing element and the at least one component together.

* * * * *